United States Patent
Karmazin et al.

(10) Patent No.: US 7,998,600 B2
(45) Date of Patent: Aug. 16, 2011

(54) DRY COMPOSITION, ITS USE, LAYER SYSTEM AND COATING PROCESS

(75) Inventors: Roman Karmazin, München (DE); Steffen Walter, Oberpframmern (DE)

(73) Assignee: Siemens Aktiengesellschaft, Munich (DE)

( * ) Notice: Subject to any disclaimer, the term of this patent is extended or adjusted under 35 U.S.C. 154(b) by 417 days.

(21) Appl. No.: 11/992,924

(22) PCT Filed: Sep. 26, 2006

(86) PCT No.: PCT/EP2006/066744
§ 371 (c)(1),
(2), (4) Date: Apr. 1, 2008

(87) PCT Pub. No.: WO2007/042392
PCT Pub. Date: Apr. 19, 2007

(65) Prior Publication Data
US 2009/0263579 A1    Oct. 22, 2009

(30) Foreign Application Priority Data
Oct. 7, 2005 (EP) .................. 05021897

(51) Int. Cl.
B05D 1/32 (2006.01)
C09D 1/00 (2006.01)
B32B 15/04 (2006.01)
C23C 16/06 (2006.01)
(52) U.S. Cl. .............. 428/698; 428/457; 416/241 B
(58) Field of Classification Search ............ None
See application file for complete search history.

(56) References Cited

U.S. PATENT DOCUMENTS

| 4,537,927 A | 8/1985 | Baldi | |
|---|---|---|---|
| 4,845,139 A | 7/1989 | Baldi | |
| 4,910,098 A | 3/1990 | Lee et al. | |
| 5,401,307 A * | 3/1995 | Czech et al. | 106/14.05 |
| 5,582,635 A * | 12/1996 | Czech et al. | 106/14.05 |
| 5,599,385 A * | 2/1997 | Czech et al. | 106/14.05 |
| 6,024,792 A | 2/2000 | Kurz et al. | |
| 6,746,783 B2 * | 6/2004 | Zhao et al. | 428/680 |
| 2003/0044634 A1* | 3/2003 | Kelly et al. | 428/633 |
| 2004/0101709 A1* | 5/2004 | Chen | 428/626 |
| 2005/0227078 A1* | 10/2005 | Power | 428/408 |
| 2008/0166561 A1* | 7/2008 | Rice et al. | 428/411.1 |

FOREIGN PATENT DOCUMENTS

| EP | 0 412 397 A1 | 2/1991 |
|---|---|---|
| EP | 0 786 017 | 2/1991 |
| EP | 0 486 489 | 11/1994 |
| EP | 0 892 090 A1 | 1/1999 |
| EP | 1 204 776 | 2/2001 |
| EP | 1 306 454 A1 | 5/2003 |
| EP | 1 319 729 A1 | 6/2003 |
| EP | 1 522 603 A1 | 4/2005 |
| GB | 2 210 387 A | 6/1989 |
| GB | 2 401 117 A | 11/2004 |
| JP | 07180033 * | 7/1995 |
| WO | WO 99/67435 A1 | 12/1999 |
| WO | WO 00/44949 A1 | 8/2000 |

* cited by examiner

Primary Examiner — Timothy M Speer
Assistant Examiner — Vera Katz

(57) ABSTRACT

Coating processes are often only intended to be applied locally. At the same time, local coating processes cannot always be used, so that frequently masking has to be used. A protective layer contains a binder and titanium oxide and can be used as a diffusion barrier, so that, in a coating process, the coating material is only applied locally. The binder is converted into carbon before the coating.

5 Claims, 5 Drawing Sheets

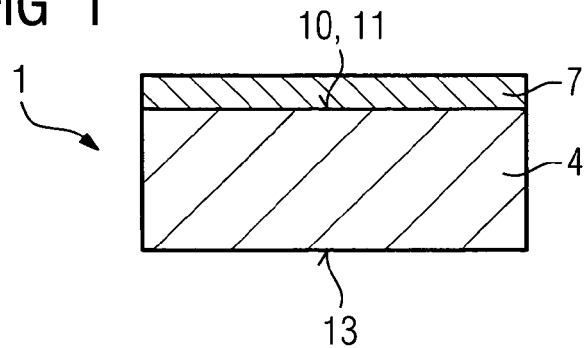
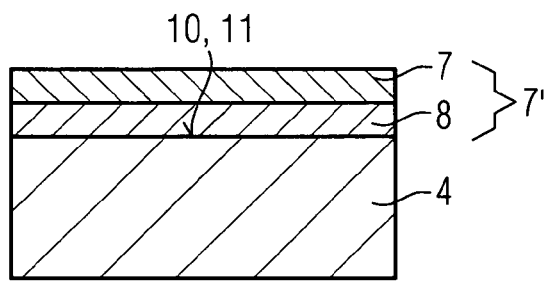
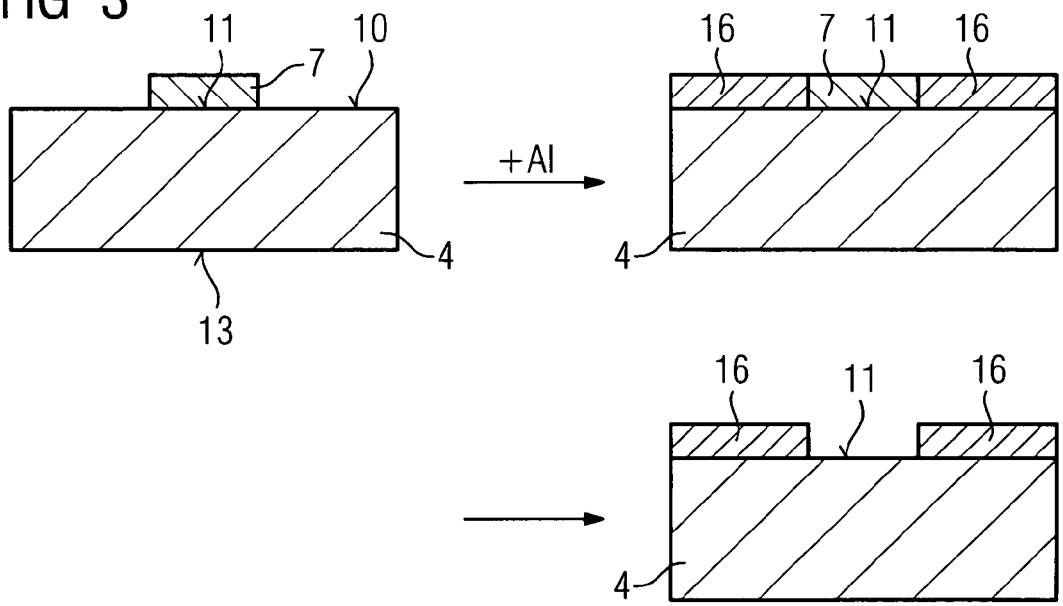

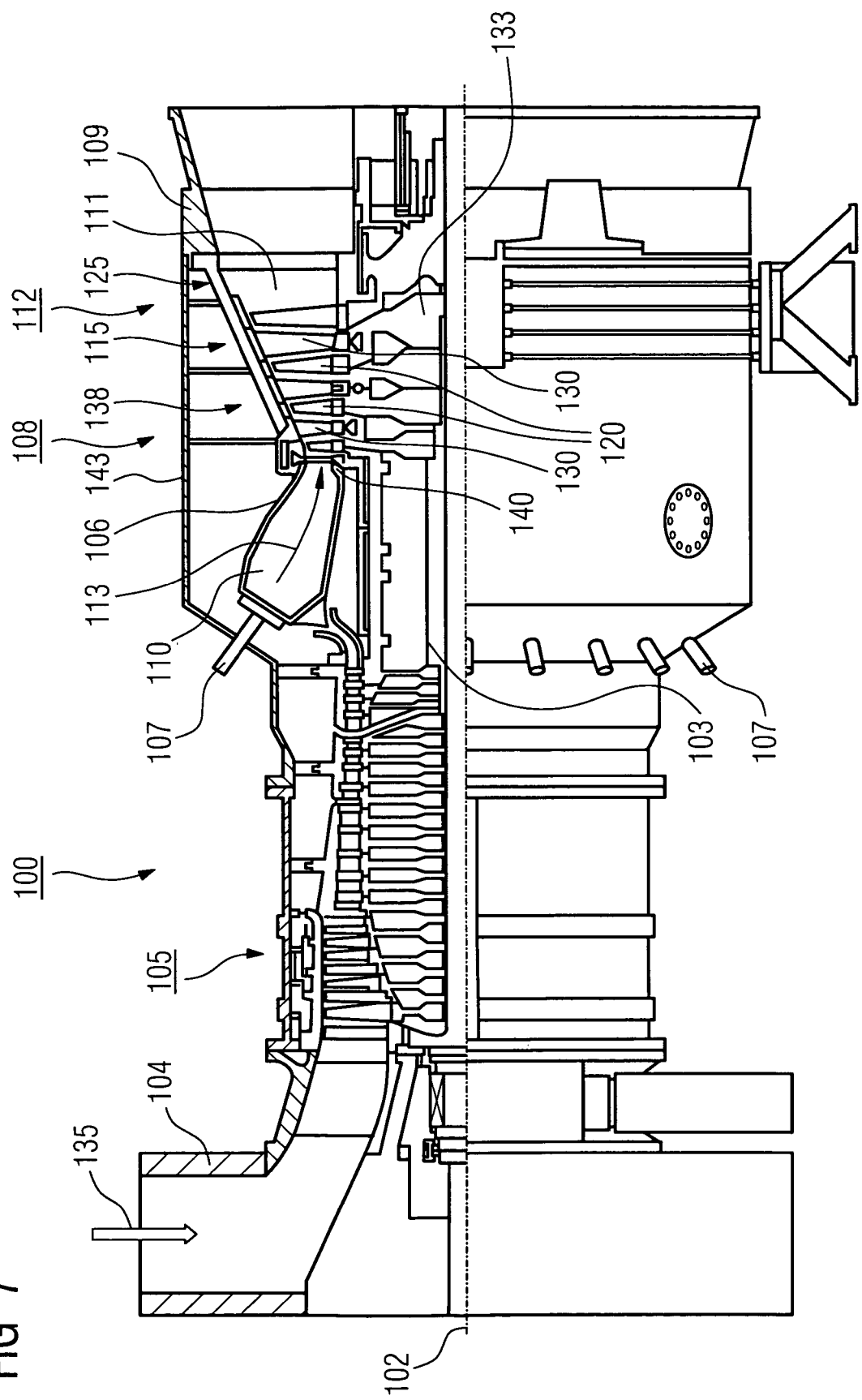

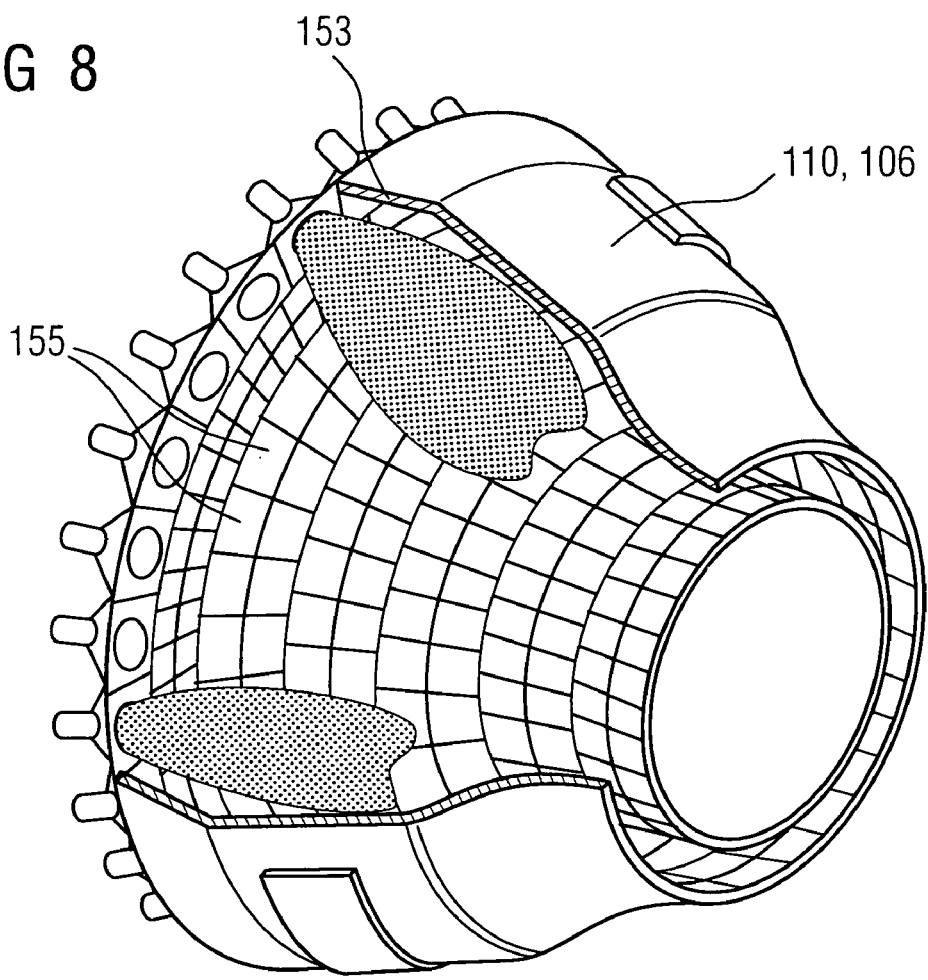

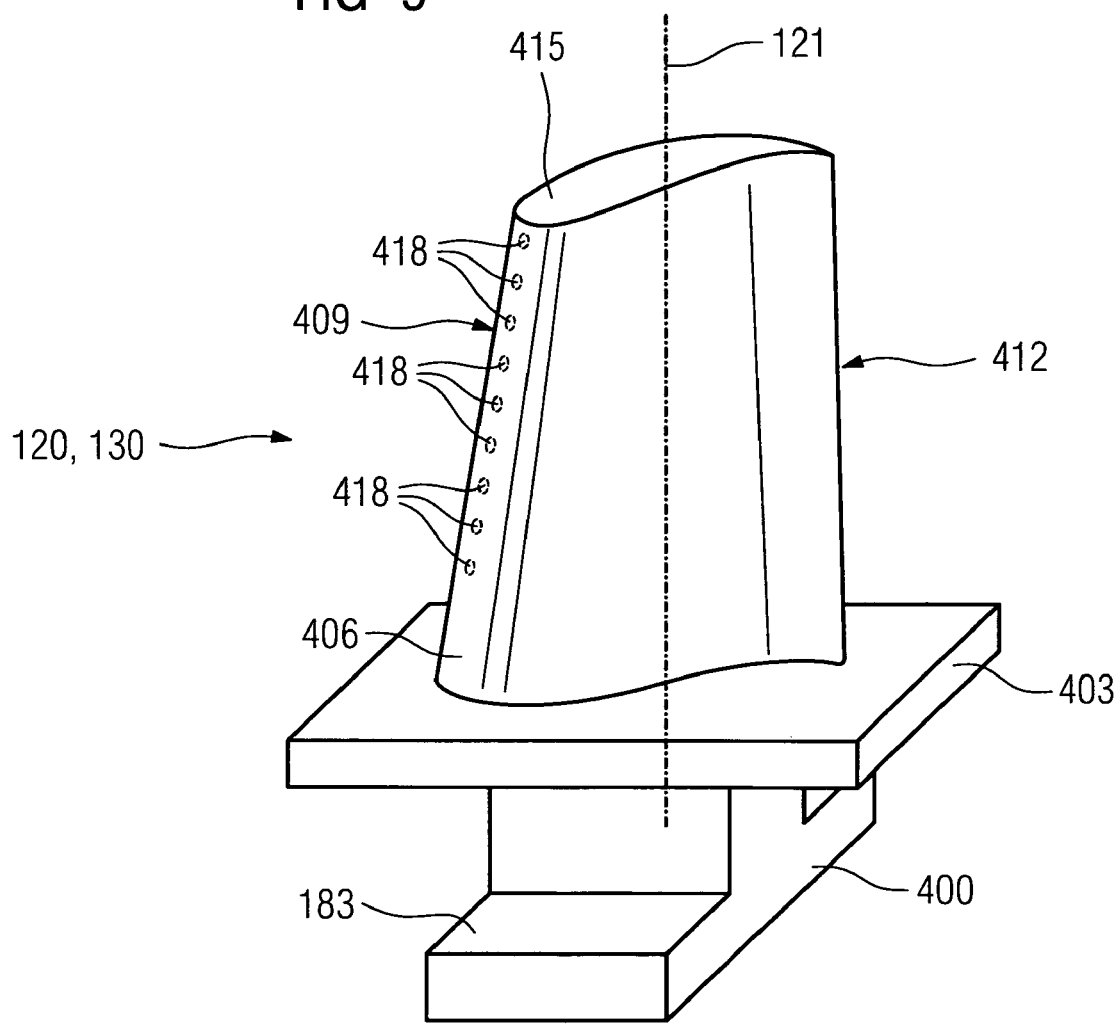

DRY COMPOSITION, ITS USE, LAYER SYSTEM AND COATING PROCESS

CROSS REFERENCE TO RELATED APPLICATIONS

This application is the US National Stage of International Application No. PCT/EP2006/066744, filed Sep. 26, 2006 and claims the benefit thereof. The International Application claims the benefits of European Patent Office application No. 05021897 EP filed Oct. 7, 2005, both of the applications are incorporated by reference herein in their entirety.

FIELD OF INVENTION

The invention relates to a dry composition, to a use thereof, to a layer system and to a coating process.

BACKGROUND OF INVENTION

Many coating processes often only require local coating. This may be the case in all conventional coating processes, for example in plasma spraying (atmospheric plasma spraying APS, low-pressure plasma spraying LPPS, VPS . . . ) or in PVD and CVD processes. In what is known as the pack process, in which the component to be coated is introduced into a powder bed, it is also at times required that only local coating be carried out.

It is also the case that at times masking is required if a coating process that permits local coating without further auxiliary measures is being used. This is the case for example with slurry processes, wherein the slurry is applied locally and as a result of the slurry being heated the coating material is introduced or applied on only a local basis, but a cloud of vapor of the coating material can be deposited on other regions of the component.

SUMMARY OF INVENTION

Therefore, it is an object of the invention to provide a composition for a protective layer to act as a mask that is easy to use.

The object is achieved by the dry composition and by its use as claimed in an independent claim.

Moreover, it is an object of the invention to provide a layer system which permits local coating of a component and in which a protective layer acting as a masking can easily be removed.

The object is achieved by the layer system as claimed in a further independent claim.

A further object of the invention is to provide a coating process in which a local coating of a component can be produced and in which the masking can easily be removed.

The object is achieved by the process as claimed in a further independent claim.

The measures listed in the subclaims can be combined with one another in any advantageous way.

BRIEF DESCRIPTION OF THE DRAWINGS

In the drawing:
FIGS. 1, 2 diagrammatically depict a component with a large-area masking,
FIGS. 3, 4 diagrammatically depict a component with local masking and a coating process,
FIG. 7 shows a perspective view of a gas turbine,
FIG. 8 shows a perspective view of a combustion chamber,
FIG. 9 shows a perspective view of a turbine blade or vane.

DETAILED DESCRIPTION OF INVENTION

Figure 4:
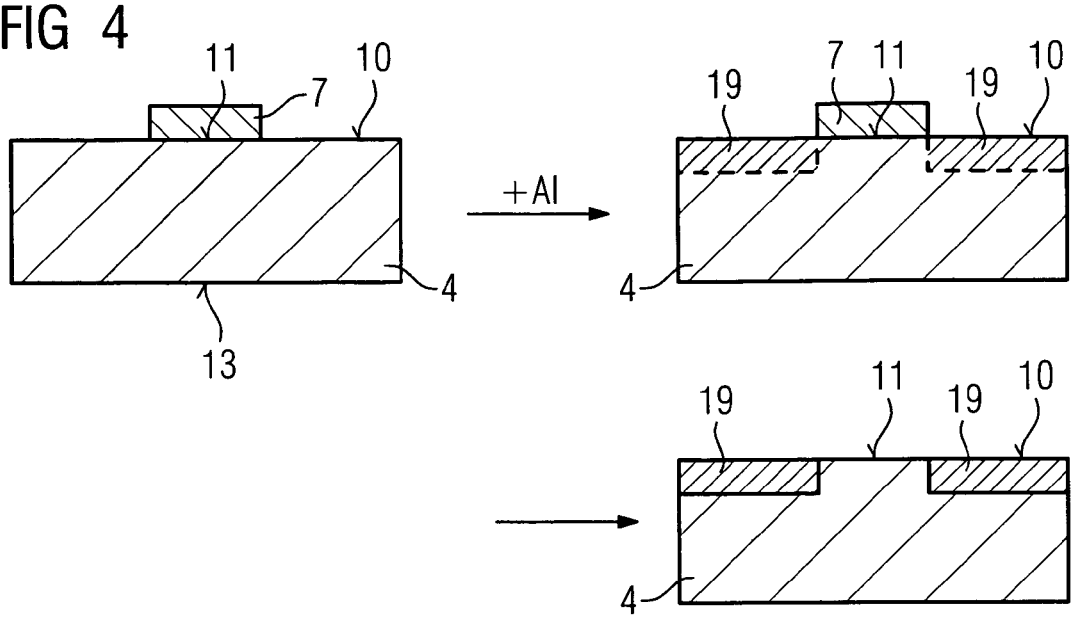

FIG. 1 shows a component 1 which comprises a substrate 4 to which a protective layer 7 has been applied.

The component 1 may be a turbine blade or vane 120, 130 (FIG. 9), a housing 138 (FIG. 7) or a combustion chamber element 155 (FIG. 8) of a steam or gas turbine 100 (FIG. 7) or any other component that is coated by means of a known coating process.

The substrate 4 has an outer surface 10 and an inner surface 13, and the outer surface 10 is not to be coated in a coating process, i.e. the outer surface 10 constitutes the region 11 that is not to be coated. Consequently, the protective layer 7 is applied to the entire surface 11.

The protective layer 7 comprises a dry composition according to the invention consisting of carbon (C) and nickel (Ni) powder.

The carbon may be in chemically bonded form with other chemical elements, in particular as organic binder, which is converted into carbon during a heat treatment (age-hardening).

The carbon of the dry composition may be at least partially, in particular completely, in chemically bonded form.

It is also possible for the carbon of the dry composition to be at least partially or completely formed from a carbon powder, for example from graphite powder or from carbon black.

Preferably, the carbon of the dry composition consists of carbon in powder form and a binder which is converted into carbon in a heat treatment process.

The dry composition can be applied to the surface 11 of a component 1, 120, 130, 138, 155 in the form of a paste or a slurry.

The protective layer 7 can be applied to any surface 10 or 13 of the component 1, 120, 130 and is preferably applied to the component 1, 120, 130, 138, 155 as a slurry over a large area but also in a locally restricted manner.

The binder is either so soft (viscous) that it can be applied as a paste or alternatively a solvent (for example water, alcohol) is added to the dry composition so as to sufficiently reduce the viscosity. It is preferable to mix the binder with Novolak. The base resin Novolak is a polymer product of phenol and/or cresol and formaldehyde, which is formed by a polycondensation reaction. The number of chain segments n is approximately 1000 to 2000. Novolak is a very brittle material, its softening point is approximately 100° C.

Further non-carbonaceous binder or another carbonaceous binder may be added to the dry composition, the paste or the slurry.

Prior to coating, the binder and/or the carrier can be expelled and the nickel/carbon powder can preferably be sintered.

The protective layer 7 is preferably suitable for vapor phase coating processes, for example the PVD or CVD process, in which a cloud of vapor of a material is deposited on a surface. In this case, the protective layer 7 forms a masking which acts as a diffusion barrier as a result of the nickel reacting with the gaseous coating material.

When aluminizing a component 1, the nickel reacts to form nickel-aluminum (for example $Al_3Ni$), thereby further intensifying the protective action of the protective layer 7.

The coating material cannot penetrate through this protective layer 7.

The protective layer 7 formed in this way is often very brittle and can in this case be removed by a simple coating removal process, such as for example dry ice blasting.

It is also possible for a protective layer 7 of this type to be used in chromizing.

The Ni/C composition is preferably used for nickel-based materials, since in this case diffusion of nickel in the substrate 4 into the masking or reaction between nickel in the substrate 4 and the nickel-containing protective layer 7 is reduced or even prevented, since there is a concentration gradient that prevents it.

As a result of the in particular higher nickel content in the protective layer 7 during the coating process, a nickel concentration gradient is formed. This prevents the diffusion of nickel out of the base material into the layers close to the surface. The higher nickel concentration in the protective layer 7 on the surface 11 of the substrate 4 counteracts the nickel diffusion in the substrate 4 and prevents its segregation.

In the case of alitizing of a nickel-based alloy using a protective layer without nickel, nickel diffusion results in the formation deeper in the substrate of a 40 μm wide segregation layer, which includes chromium-rich and aluminum-rich regions, while the substrate 4 remains in the starting state lower in the substrate 4.

Once the component 1, 120, 130 has been in use, however, the region of the segregation layer is also removed. This is of course undesirable.

By using the dry composition containing nickel and carbon, it is possible to prevent both the diffusion of aluminum during a coating process and the formation of the segregation layer.

FIG. 2 shows a further protective layer 7' according to the invention. The protective layer 7' is of two-layer construction, wherein the protective layer 7 has the composition as described in FIG. 1. However, below the protective layer 7 there is a further layer 8, which in particular rests directly on the substrate 4. The protective layer 8 is a carbon-containing layer, which consists either of carbon alone or of carbon precursor materials, such as for example organic materials.

The layer 8 preferably consists of carbon powder and a binder, for which it is once again advantageous to use Novolak.

This carbon-containing layer makes it easier to remove the protective layer 7 once the component 1, 120, 130, 155 has been coated, since the carbon layer 8 does not react with the substrate 4 and also does not come into contact with the coating material.

It is also preferable for this two-layer system 7' to be used in an alitizing process.

FIG. 3 diagrammatically depicts a process sequence of a coating process according to the invention.

The substrate 4 is not to be coated in a region 11, and consequently a paste or a slurry is locally applied to the surface 10 in the region of the surface 11 that is not to be coated, in order to form a protective layer 7. Then, the component 1, 120, 130, 155 is subjected to the coating process, for example exposed to an aluminum vapor, with an aluminum layer 16 then forming on the surface 10 apart from the region in which the protective layer 7 is present.

After the aluminum-enriched protective layer 7 or the reaction product of protective layer 7 and coating material, in this case aluminum, has/have been removed, the result is a local coating (FIG. 3, right).

FIG. 4 shows a similar and schematic process sequence to that shown in FIG. 3, except that in this case no layer 16 is formed on the surface 10, but rather the coating material, in this case likewise for example aluminum, locally penetrates into the substrate 4, so as to form local regions 19 with an increased aluminum content.

Figure 5:
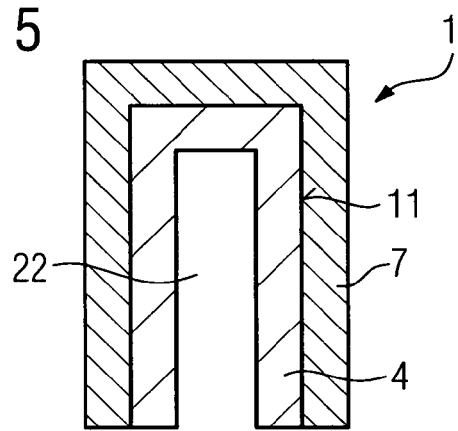
FIGS. 5, 6 show further exemplary embodiments of the invention.

FIG. 5 shows a further exemplary embodiment of the process according to the invention and of a further use of the protective layer 7.

The component 1, 120, 130, 155 has a cavity 22, which alone is to be either completely or locally coated. This is the case for example if the outer surface of the substrate 4 already has an MCrAlX layer and if appropriate a ceramic layer but the cavity 22 is also to be aluminized or chromized for corrosion prevention purposes. Then, a paste or a slurry is applied to the outer surface 10 of the substrate 4 or an outer coating on the substrate 4 to produce a protective layer 7, so that it is impossible for any coating material to reach the outer surface 11 and coating takes place only in the cavity 22.

Figure 6:
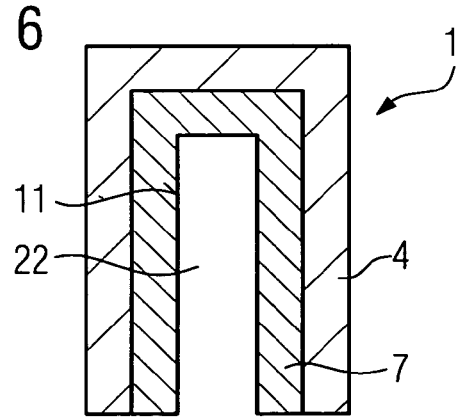

The situation may also arise whereby the outer surface of a hollow component 1, 120, 130 is to be coated, for example an MCrAlX layer or a substrate 4 is to be aluminized or chromized for corrosion prevention purposes, but the cavity 22 is not to be coated. Here, likewise a paste or a slurry is introduced into the cavity 22 in order to produce a protective layer 7 which protects the cavity 22 from coating (FIG. 6).

FIG. 7 shows, by way of example, a partial longitudinal section through a gas turbine 100.

In the interior, the gas turbine 100 has a rotor 103 with a shaft 101 which is mounted such that it can rotate about an axis of rotation 102 and is also referred to as the turbine rotor.

An intake housing 104, a compressor 105, a, for example, toroidal combustion chamber 110, in particular an annular combustion chamber, with a plurality of coaxially arranged burners 107, a turbine 108 and the exhaust-gas housing 109 follow one another along the rotor 103.

The annular combustion chamber 110 is in communication with a, for example, annular hot-gas passage 111, where, by way of example, four successive turbine stages 112 form the turbine 108.

Each turbine stage 112 is formed, for example, from two blade or vane rings. As seen in the direction of flow of a working medium 113, in the hot-gas passage 111 a row of guide vanes 115 is followed by a row 125 formed from rotor blades 120.

The guide vanes 130 are secured to an inner housing 138 of a stator 143, whereas the rotor blades 120 of a row 125 are fitted to the rotor 103 for example by means of a turbine disk 133.

A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot-gas passage 111 past the guide vanes 130 and the rotor blades 120. The working medium 113 is expanded at the rotor blades 120, transferring its momentum, so that the rotor blades 120 drive the rotor 103 and the latter in turn drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield elements which line the annular combustion chamber 110, are subject to the highest thermal stresses.

To be able to withstand the temperatures which prevail there, they have to be cooled by means of a coolant.

Substrates of the components may likewise have a directional structure, i.e. they are in single-crystal form (SX structure) or have only longitudinally oriented grains (DS structure).

By way of example, iron-base, nickel-base or cobalt-base superalloys are used as material for the components, in particular for the turbine blade or vane 120, 130 and components of the combustion chamber 110.

Superalloys of this type are known, for example, from EP 1 204 776 B1, EP 1 306 454, EP 1 319 729 A1, WO 99/67435 or WO 00/44949; these documents form part of the disclosure with regard to the chemical composition of the alloys.

The blades or vanes 120, 130 may also have coatings which protect against corrosion (MCrAlX; M is at least one element selected from the group consisting of iron (Fe), cobalt (Co), nickel (Ni), X is an active element and represents yttrium (Y) and/or silicon and/or at least one rare earth element or hafnium). Alloys of this type are known from EP 0 486 489 B1, EP 0 786 017 B1, EP 0 412 397 B1 or EP 1 306 454 A1, which are intended to form part of the present disclosure with regard to the chemical composition of the alloys.

A thermal barrier coating, consisting for example of $ZrO_2$, $Y_2O_3$—$ZrO_2$, i.e. unstabilized, partially stabilized or completely stabilized by yttrium oxide and/or calcium oxide and/or magnesium oxide, may also be present on the MCrAlX.

Columnar grains are produced in the thermal barrier coating by suitable coating processes, such as for example electron beam physical vapor deposition (EB-PVD).

The guide vane 130 has a guide vane root (not shown here), which faces the inner housing 138 of the turbine 108, and a guide vane head which is at the opposite end from the guide vane root. The guide vane head faces the rotor 103 and is fixed to a securing ring 140 of the stator 143.

FIG. 8 shows a combustion chamber 110 of a gas turbine 100. The combustion chamber 110 is configured, for example, as what is known as an annular combustion chamber, in which a multiplicity of burners 107, which generate flames 156, arranged circumferentially around the axis of rotation 102 open out into a common combustion chamber space 154. For this purpose, the combustion chamber 110 overall is of annular configuration positioned around the axis of rotation 102.

To achieve a relatively high efficiency, the combustion chamber 110 is designed for a relatively high temperature of the working medium M of approximately 1000° C. to 1600° C. To allow a relatively long service life even with these operating parameters, which are unfavorable for the materials, the combustion chamber wall 153 is provided, on its side which faces the working medium M, with an inner lining formed from heat shield elements 155.

On the working medium side, each heat shield element 155 made from an alloy is equipped with a particularly heat-resistant protective layer (MCrAlX layer and/or ceramic coating) or is made from material that is able to withstand high temperatures (solid ceramic bricks).

These protective layers may be similar to the turbine blades or vanes, i.e. for example MCrAlX: M is at least one element selected from the group consisting of iron (Fe), cobalt (Co), nickel (Ni), X is an active element and stands for yttrium (Y) and/or silicon and/or at least one rare earth or hafnium (Hf). Alloys of this type are known for example from EP 0 486 489 B1, EP 0 786 017 B1, EP 0 412 397 B1 or EP 1 306454 A1, which are intended to form part of the present disclosure with regard to the chemical composition of the alloy.

It is also possible for a, for example, ceramic thermal barrier coating to be present on the MCrAlX, consisting for example of $ZrO_2$, $Y_2O_4$—$ZrO_2$, i.e. unstabilized, partially stabilized or fully stabilized by yttrium oxide and/or calcium oxide and/or magnesium oxide.

Columnar grains are produced in the thermal barrier coating by means of suitable coating processes, such as for example electron beam physical vapor deposition (EB-PVD).

Refurbishment means that after they have been used, protective layers may have to be removed from heat shield elements 155 (e.g. by sand-blasting). Then, the corrosion and/or oxidation layers and products are removed. If appropriate, cracks in the heat shield element 155 are also repaired. It is followed by recoating of the heat shield elements 155, after which the heat shield elements 155 can be reused.

Moreover, a cooling system may be provided for the heat shield elements 155 and/or their holding elements, on account of the high temperatures in the interior of the combustion chamber 110. The heat shield elements 155 are then, for example, hollow and may also have film-cooling holes (not shown) opening out into the combustion chamber space 154.

FIG. 9 shows a perspective view of a rotor blade 120 or guide vane 130 of a turbomachine, which extends along a longitudinal axis 121.

The turbomachine may be a gas turbine of an aircraft or of a power plant for generating electricity, a steam turbine or a compressor.

The blade or vane 120, 130 has, in succession along the longitudinal axis 121, a securing region 400, an adjoining blade or vane platform 403 and a main blade or vane part 406.

As a guide vane 130, the vane 130 may have a further platform (not shown) at its vane tip 415.

A blade or vane root 183, which is used to secure the rotor blades 120, 130 to a shaft or a disk (not shown), is formed in the securing region 400.

The blade or vane root 183 is designed, for example, in hammerhead form. Other configurations, such as a fir-tree or dovetail root, are possible.

The blade or vane 120, 130 has a leading edge 409 and a trailing edge 412 for a medium which flows past the main blade or vane part 406.

In the case of conventional blades or vanes 120, 130, by way of example solid metallic materials, in particular superalloys, are used in all regions 400, 403, 406 of the blade or vane 120, 130.

Superalloys of this type are known, for example, from EP 1 204 776 B1, EP 1 306 454, EP 1 319 729 A1, WO 99/67435 or WO 00/44949; these documents form part of the disclosure with regard to the chemical composition of the alloy.

The blade or vane 120, 130 may in this case be produced by a casting process, including by means of directional solidification, or by a forging process, by a milling process or a combination of these.

Workpieces with a single-crystal structure or structures are used as components for machines which, in operation, are exposed to high mechanical, thermal and/or chemical stresses.

Single-crystal workpieces of this type are produced, for example, by directional solidification from the melt. This involves casting processes in which the liquid metallic alloy solidifies to form the single-crystal structure, i.e. the single-crystal workpiece, or solidifies directionally. In this case, dendritic crystals are oriented along the direction of heat flow and form either a columnar crystalline grain structure (i.e. grains which run over the entire length of the workpiece and are referred to here, in accordance with the language customarily used, as directionally solidified) or a single-crystal structure, i.e. the entire workpiece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, as well as columnar crystal structures, which do have grain boundaries running in the longitudinal direction but do not have any transverse grain boundaries. This second form of crystalline structures is also described as directionally solidified microstructures (directionally solidified structures).

Processes of this type are known from U.S. Pat. No. 6,024,792 and EP 0 892 090 A1; these documents form part of the disclosure.

Refurbishment means that after they have been used, protective layers may have to be removed from components 120, 130 (e.g. by sand-blasting). Then, the corrosion and/or oxidation layers and products are removed. If appropriate, cracks in the component 120, 130 are also repaired. This is followed by recoating of the component 120, 130, after which the component 120, 130 can be reused.

The blade or vane 120, 130 may be hollow or solid in form.

If the blade or vane 120, 130 is to be cooled, it is hollow and may also have film-cooling holes 418 (indicated by dashed lines).

The invention claimed is:

1. A layer system used to coat a substrate with a coating layer, comprising:

a substrate comprised of a nickel-based alloy; and
a protective mask layer on a surface of the substrate that is not to be coated with the coating layer,
a coating layer formed on the surface of the substrate in areas not covered by the protective mask layer;
wherein the protective mask layer has a non-sintered dry composition,
wherein the dry composition consists essentially of carbon powder and a nickel powder,
wherein the carbon powder may be at least partially in chemically bonded form, and,
wherein the protective mask layer has a nickel concentration gradient with a higher nickel concentration at a surface of the substrate thereby preventing diffusion of nickel from the substrate into the protective mask layer, and the protective mask layer is removed after application of the coating layer.

2. The layer system as claimed in claim 1, wherein the protective mask layer is of at least a two-layer construction, wherein a carbon-containing layer is on the substrate, wherein an outer layer, containing the dry composition, is present on the carbon-containing layer.

3. The layer system as claimed in claim 2, the carbon-containing layer is formed by a carbon powder and/or a chemically bonded carbon, wherein the chemically bonded carbon is bounded on an organic binder.

4. The layer system as claimed in claim 1, wherein the substrate is a nickel-based alloy.

5. The layer system as claimed in claim 4, wherein a nickel content in the protective mask layer is at least equal to the nickel content in the substrate.

* * * * *